(12) United States Patent
Chang et al.

(10) Patent No.: US 9,002,688 B2
(45) Date of Patent: Apr. 7, 2015

(54) SYSTEM AND METHOD FOR SIMULATING MEASURING PROCESS OF WORKPIECE

(75) Inventors: Chih-Kuang Chang, New Taipei (TW); Xin-Yuan Wu, Shenzhen (CN); Min Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 517 days.

(21) Appl. No.: 13/316,489

(22) Filed: Dec. 10, 2011

(65) Prior Publication Data

US 2012/0197615 A1 Aug. 2, 2012

(30) Foreign Application Priority Data

Jan. 28, 2011 (CN) .......................... 2011 1 0031179

(51) Int. Cl.
*G06F 17/50* (2006.01)
*G01B 21/04* (2006.01)
*G05B 19/401* (2006.01)

(52) U.S. Cl.
CPC .......... *G06F 17/5009* (2013.01); *G01B 21/047* (2013.01); *G05B 2219/35346* (2013.01)

(58) Field of Classification Search
CPC .... G01B 21/04; G01B 21/047; G05B 19/401; G05B 2219/37443; G05B 23/0216; G06F 17/5009; G06T 7/0006; G06T 19/00; G06T 2207/30164
See application file for complete search history.

(56) References Cited

U.S. PATENT DOCUMENTS

| | | | | |
|---|---|---|---|---|
| 5,465,221 | A  * | 11/1995 | Merat et al. | 702/83 |
| 2005/0171733 | A1 * | 8/2005 | Hough | 702/182 |
| 2005/0281453 | A1 * | 12/2005 | Boyer | 382/141 |
| 2006/0122804 | A1 * | 6/2006 | Chang et al. | 702/127 |

OTHER PUBLICATIONS

Albuquerque et al., Inspection point placement and path planning algorithms for automatic CMM inspection, Int. J. Computer Integrated Manufacturing, 2000, vol. 13, No. 2, 107-120.*
Computer Numerical Control (CNC), Oct. 22, 2007, Retrieved: wings.buffalo.edu/academic/department/eng/mae/courses/460-564/Course-Notes/CNC_notes.pdf.*
Gu, A knowledge-based inspection process planning system for coordinate measuring machines, Journal of Intelligent Manufacturing (1994) 5, 351-363.*

(Continued)

*Primary Examiner* — Kandasamy Thangavelu
*Assistant Examiner* — Michael P Healey
(74) *Attorney, Agent, or Firm* — Novak Druce Connolly Bove + Quigg LLP

(57) ABSTRACT

In a method for simulating a measuring process of a workpiece, one or more virtual probes of a workpiece measuring machine are created. A vector of each of the virtual probes is calculated, and an appropriate vector for each of measuring points of a workpiece is acquired for a computerized drawing of the workpiece. The angle between the vector of each of the measuring points and the vector of each of the virtual probes is calculated. A virtual probe is determined for each measuring point according to the calculated angles. The measuring points are sorted according to the virtual probe of each measuring point, and the measuring programs of the sorted measuring points that relate to the same virtual probe are combined. The combined measuring programs are executed to determine whether the actual probe would collide with the workpiece.

16 Claims, 7 Drawing Sheets

(56) References Cited

OTHER PUBLICATIONS

Hu, Investigation and Development of an Advanced Virtual Coordinate Measuring Machine, School of Engineering and Design, Brunel University, May 2010.*

Secondary Storage, TechTerms.com, Dec. 31, 2009, Retrieved: www.techterms.com/definition/secondarystorage.*

Spyridi et al., Accessibility Analysis for the Automatic Inspection of Mechanical Parts by Coordinate Measuring Machines, IEEE 1990.*

Zhang et al., A feature-based inspection process planning system for co-ordinate measuring machine (CMM), Journal of Materials Processing Technology 107 (2000) 111-118.*

* cited by examiner

| Virtual probes list |||| 
|---|---|---|---|
| Virtual probe (TIP/A, B) | First angle of the virtual probe | Second angle of the virtual probe | Vector of the virtual probe (IJK) |
| TIP/A 0, B 0 | 0 | 0 | (0, 0, 1) |
| TIP/A 15, B15 | 15 | 15 | (0.25, 0.07, 0.97) |

FIG. 3

$$MatA = \begin{Bmatrix} 1 & 0 & 0 & 0 \\ 0 & \cos A & -\sin A & 0 \\ 0 & \sin A & \cos A & 0 \\ 0 & 0 & 0 & 1 \end{Bmatrix}$$

$$MatB = \begin{Bmatrix} \cos B & -\sin B & 0 & 0 \\ \sin B & \cos B & 0 & 0 \\ 0 & 0 & 1 & 0 \\ 0 & 0 & 0 & 1 \end{Bmatrix}$$

$$NewIJK = IJK \times MatA \times MatB$$

FIG. 4

SYSTEM AND METHOD FOR SIMULATING MEASURING PROCESS OF WORKPIECE

BACKGROUND

1. Technical Field

Embodiments of the present disclosure relate generally to workpiece measuring technologies, and particularly to a system and method for simulating a measuring process of a workpiece on a production line.

2. Description of Related Art

In an automatic process, workpieces on a production line should be measured to ensure all dimensions of the workpieces are within predetermined tolerances. This process may be measured automatically using a workpiece measuring machine with a probe to check the workpieces. During the automatic process, a customized measuring program needs to be loaded into the workpiece measuring machine to control the probe to measure the workpieces. To finish a measuring process of a workpiece, the probe may be automatically rotated to measure a plurality of points of the workpiece. However, collisions between the probe and the workpiece may happen while the probe is rotating, which are not only likely to damage the probe, but also the measured workpiece.

BRIEF DESCRIPTION OF THE DRAWINGS

FIG. 3 is a schematic diagram of a virtual probe list.

FIG. 4 illustrates one example of calculating a vector of a virtual probe.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
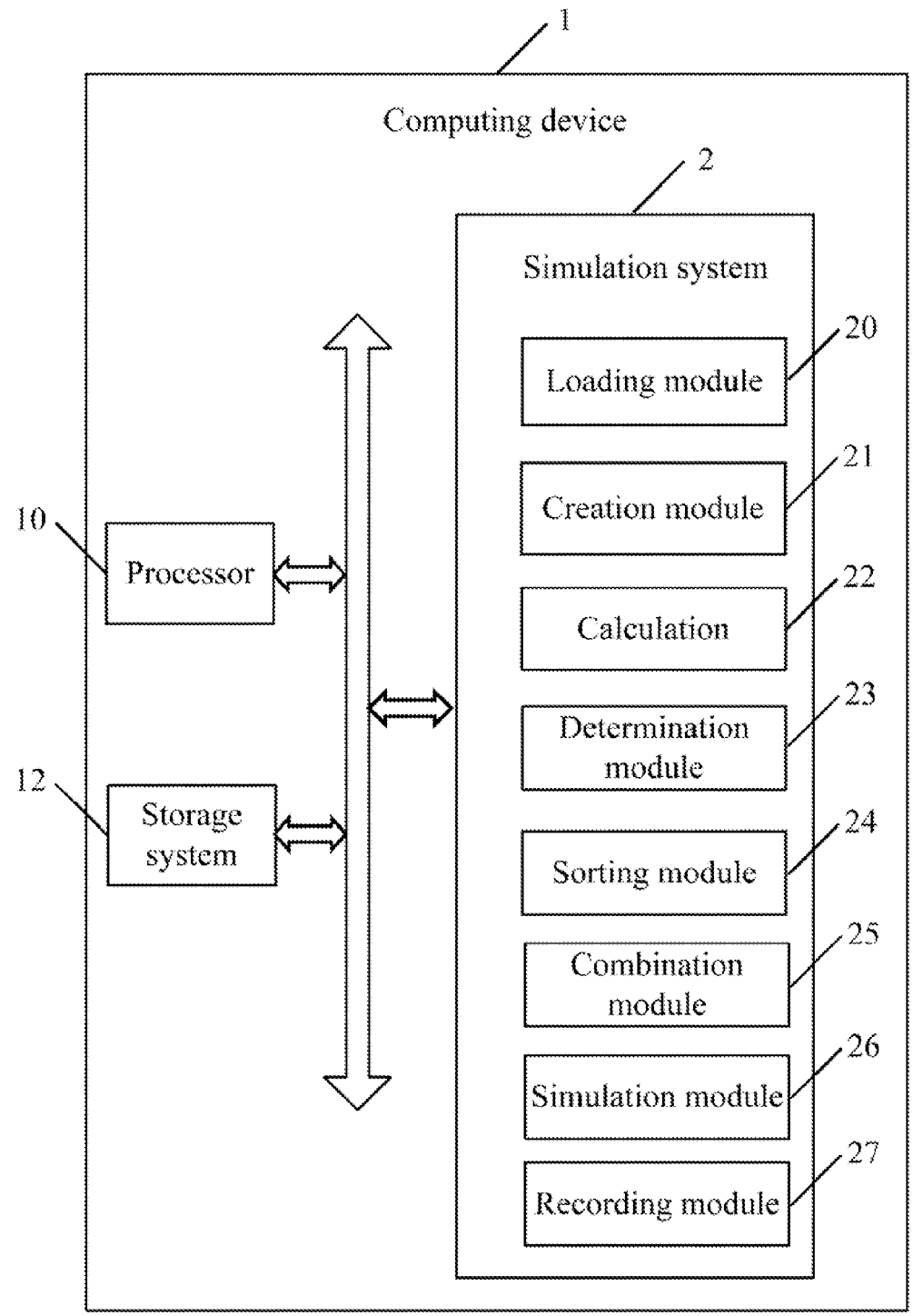
FIG. 1 is a block diagram of one embodiment of a computing device including a simulation system.

FIG. 1 is a block diagram of one embodiment of a computing device 1 including a simulation system 2. The computing device 1 further includes a processor 10, and a storage system 12. The simulation system 2 simulates a measuring process of a workpiece by creating multiple virtual probes for measuring points of the workpiece, to detect whether the actual probe of the workpiece measuring machine would collide with the workpiece during an actual measuring process. The computing device may be, for example, a server, or a computer. It is understood that FIG. 1 is only one example of the computing device 1 that can include more or fewer components than those shown in the embodiment, or a different configuration of the various components.

The storage system 12 stores one or more programs, including firmware or other applications of the computing device 1, executed by the processor 10 to provide functions of the computing device 1. In one embodiment, the storage system 12 may be a random access memory (RAM) for temporary storage of information, and/or a read only memory (ROM) for permanent storage of information. In other embodiments, the storage system 12 may also be an external storage device, such as a hard disk, a storage card, or a data storage medium.

The simulation system 2 may include a plurality of software programs in the form of one or more computerized instructions stored in the storage system 12, and executed by a processor 10, to perform operations of the computing device 1. In the embodiment, the simulation system 2 includes a loading module 20, a creation module 21, a calculation module 22, a determination module 23, a sorting module 24, a combination module 25, a simulation module 26, and a recording module 27. In general, the word "module", as used herein, refers to logic embodied in hardware or firmware, or to a collection of software instructions, written in a programming language, such as, JAVA, C, or assembly. One or more software instructions in the modules may be embedded in firmware, such as in an erasable programmable read only memory (EPROM). The modules described herein may be implemented as either software and/or hardware modules and may be stored in any type of non-transitory computer-readable medium or other storage device. Some non-limiting examples of non-transitory computer-readable medium include compact discs (CDs), digital versatile discs (DVDs), BLU-RAY, flash memory, and hard disk drives. Details of the modules 20-27 are provided as follows.

Figure 5:
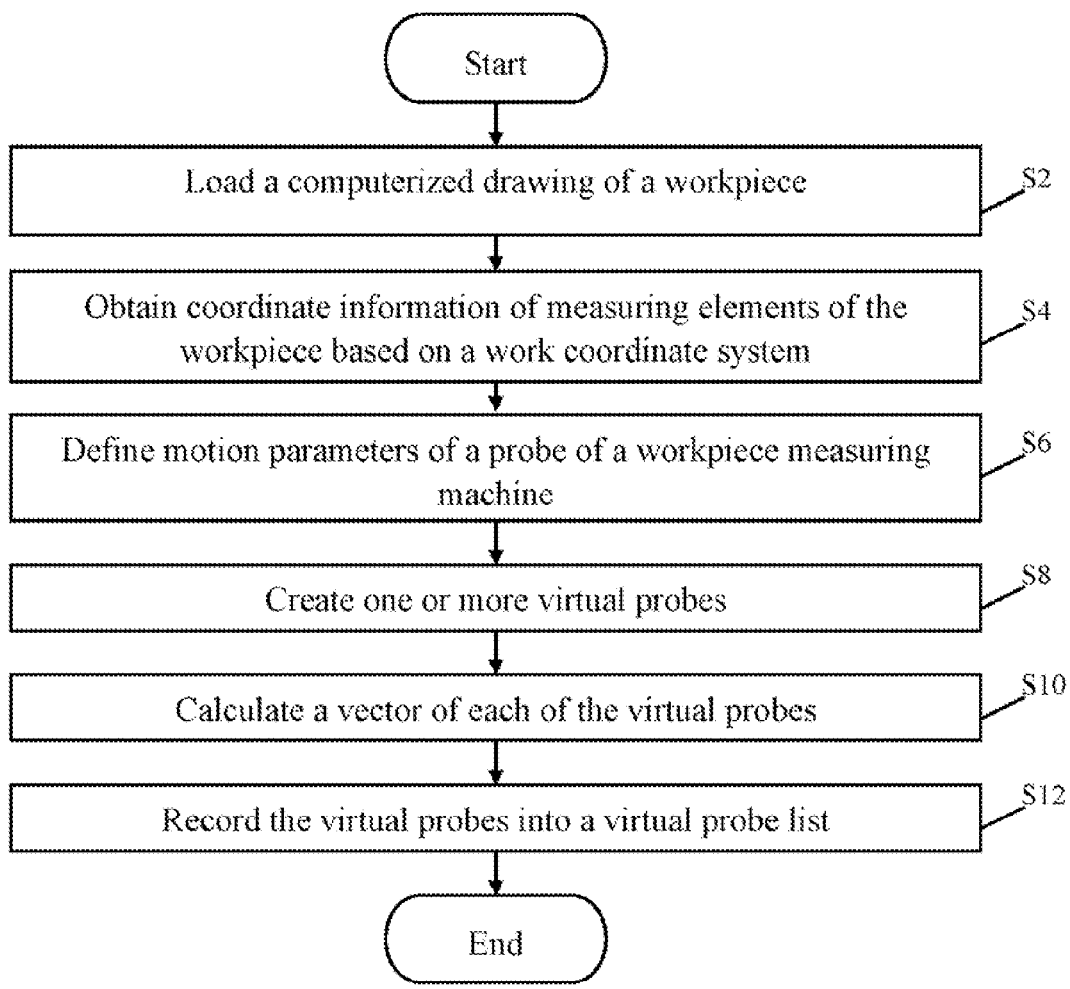
FIG. 5 is a flowchart of one embodiment of a method of creating virtual probes for measuring points of a workpiece.
Figure 6:
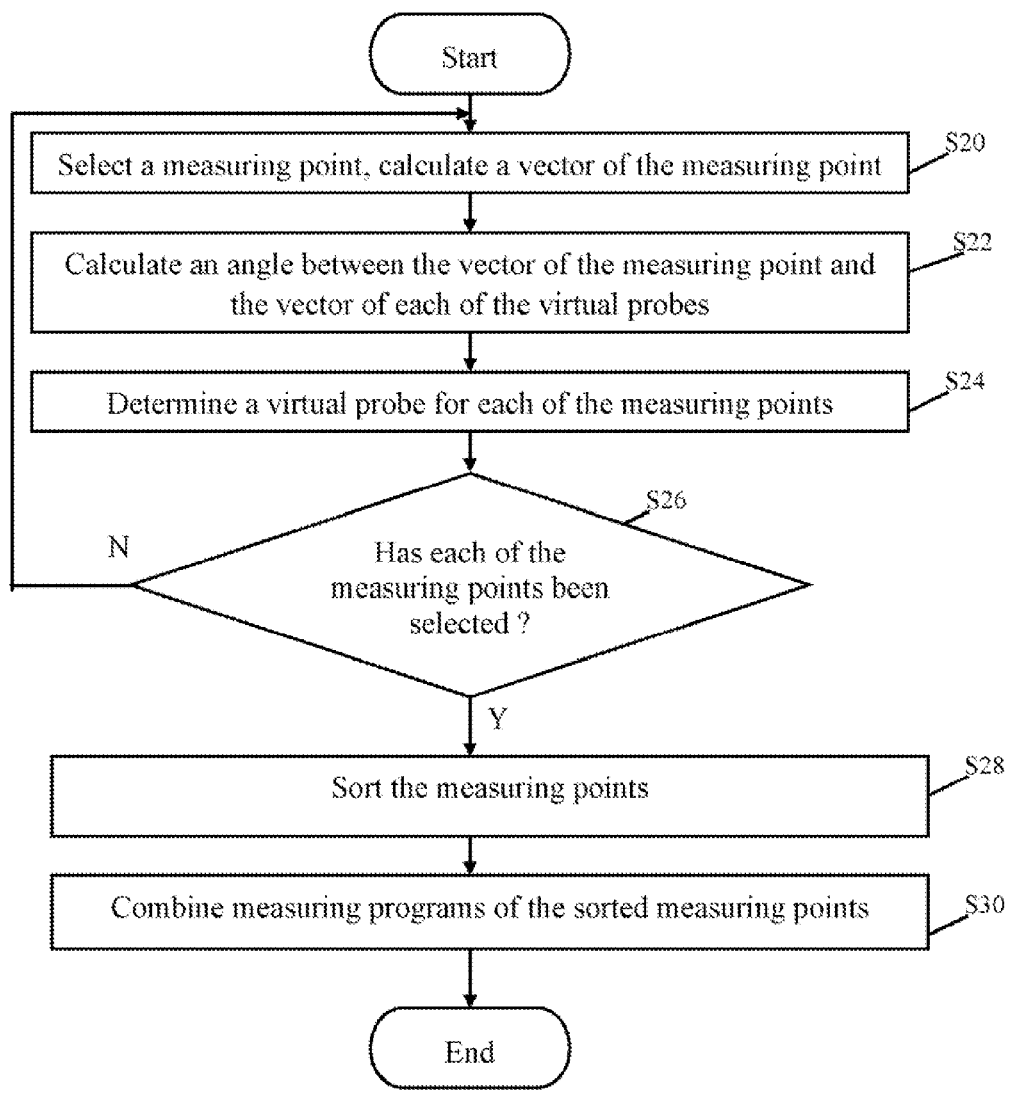
FIG. 6 is a flowchart of one embodiment of a method of integrating measuring program of measuring points of measuring elements of the workpiece.
Figure 7:
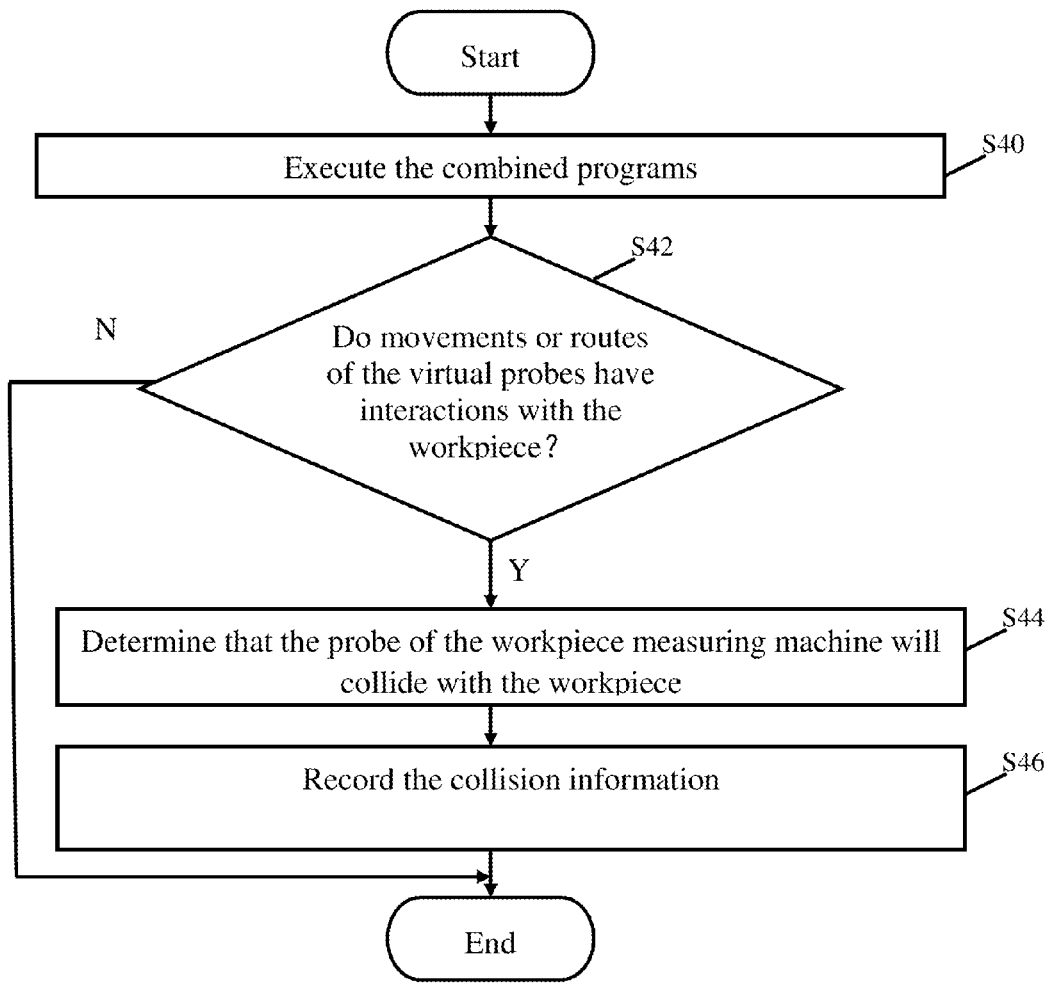
FIG. 7 is a flowchart of one embodiment of simulating a measuring process of the workpiece by executing the combined measuring programs.

In one embodiment, a whole process of a method for simulating a measuring process of the workpiece is illustrated in FIG. 5 to FIG. 7 and described as follows.

FIG. 5 is a flowchart of one embodiment of creating virtual probes for measuring points of the workpiece. Depending on the embodiment, additional steps may be added, others removed, and the ordering of the steps may be changed.

In step S2, the loading module 20 loads a computerized drawing of a workpiece to be measured. In the embodiment, the computerized drawing may be a computer aided design (CAD) drawing that is prestored in the storage system 12.

In step S4 the loading module 20 obtains coordinate information of measuring elements of the workpiece based on a work coordinate system (WCS). In one embodiment, the measuring elements include, for example, points, lines, circles, and planes of the workpiece. The WCS is a standard coordinate system used in a CAD system.

Figure 2:
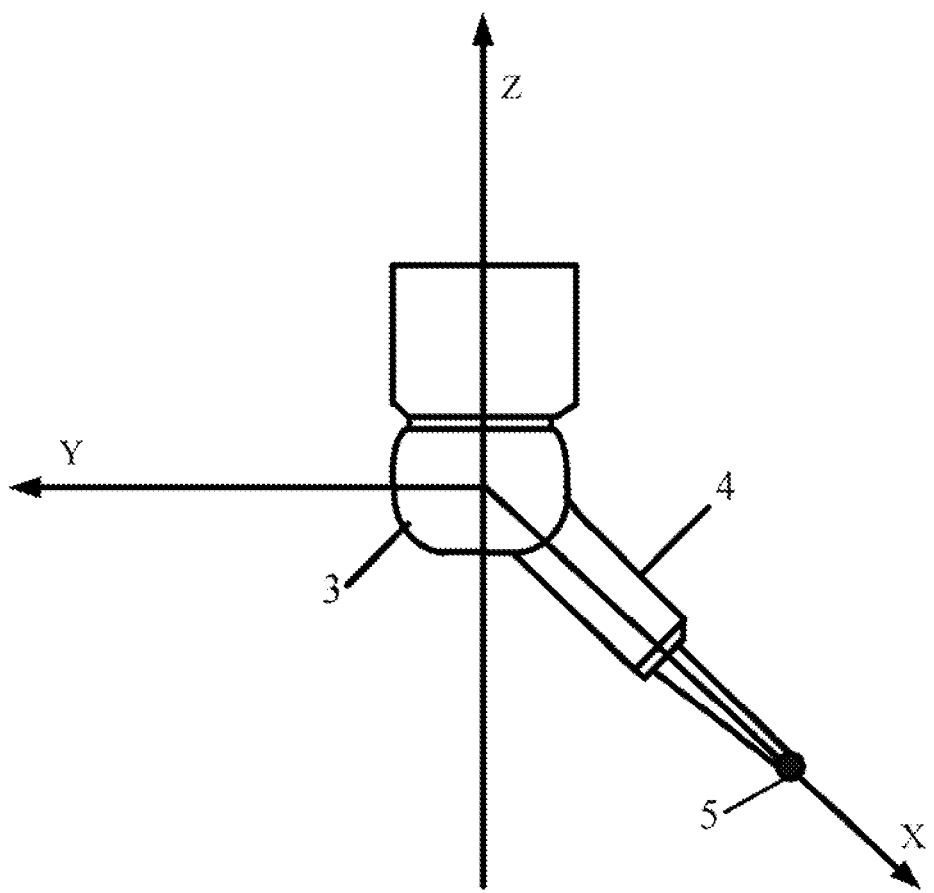
FIG. 2 illustrates one example of a probe of a workpiece measuring machine of FIG. 1.

In step S6, the creation module 21 defines motion parameters of the probe. The motion parameters include a range of rotation, and a step angle of the probe. In the example, as shown in FIG. 2, the probe includes a supported end 3, a free end 4, and a workpiece-contacting tip 5. Both the supported end 3 and the free end 4 can be rotated, so that the probe can be moved along any of an X-axis, a Y-axis, and a Z-axis. Since the probe can be rotated about either a horizontal axis or a vertical axis, the range of rotation includes a horizontal range of a first rotation angle of the supported end 3, and a vertical range of a second rotation angle of the free end 4. The horizontal range, in one example, can be [−180°, +180°], and the vertical range can be [0°,105°]. The step angle may be 15 °.

In step S8, the creation module 21 creates one or more virtual probes according to the range of rotation and the step angle, and records the one or more virtual probes in a virtual probe list stored in the storage system 12, such as the list of FIG. 3. In the embodiment, each of the virtual probes corresponds to a first rotation angle and a second rotation angle.

In one example, as shown in FIG. 3, when both the first rotation angle and the second rotation angle are 0°, a virtual probe "TIP/A 0, B 0" is created. When both the first rotation angle and the second rotation angle are 15°, a virtual probe "TIP/A 15, B 15" is created. "A" represents the first rotation angle, and "B" represents the second rotation angle. The creation module 21 can create other virtual probes, such as "TIP/A 0, B 15", "TIP/A 15, B 0", "TIP/A 30, B 30", ..., "TIP/A 180, B 105".

In step S10, the calculation module 22 calculates a vector of each of the one or more virtual probes according to the first rotation angle "A" and the second rotation angle "B" of each virtual probe. For example, the vector of virtual probe "TIP/A 0, B 0" is the vector from the original point (0, 0, 0) to a particular point "(0, 0, 1)". When the first rotation angle and the second rotation angle are not 0 degree, the calculation module 22 may calculate the vector of another virtual probe using the formula of FIG. 4. The keyword "IJK" of FIG. 4 represents the vector of the virtual probe "TIP/A 0, B 0", and the keyword "NewIJK" represents the vector of another virtual probe that needs to be calculated.

In step S12, the calculation module 22 records the vector of each of the one or more virtual probes into the virtual probe list of FIG. 3.

FIG. 6 is a flowchart of one embodiment of integrating measuring program of the measuring points of the measuring elements into a measuring program. Depending on the embodiment, additional steps may be added, others removed, and the ordering of the steps may be changed.

In step S20, the determination module 23 selects a measuring point of the measuring elements, and acquires a vector of the measuring point from the computerized drawing of the workpiece. In one embodiment, each of the elements may include one or more measuring points. In one example, a line of the workpiece may include two measuring points, and a circle of the workpiece may include at least three measuring points.

In step S22, the determination module 23 calculates an angle between the vector of the selected measuring point and the vector of each of the virtual probes. In one example, if the vector of the measuring point is from the original point (0, 0, 0) to the point (x1, y1, z1), and a vector of a virtual probe is from the original point to the point (x2, y2, z2), the angle θ between the vector of the measuring point and the vector of the virtual probe may be calculated according to the following formula:

$$\theta = \text{ArcCOS}\left(\frac{x1 \times x2 + y1 \times y2 + z1 \times z2}{\sqrt{[(x1^2 + y1^2 + z1^2) \times (x2^2 + y2^2 + z2^2)]}}\right).$$

In step S24, the determination module 23 determines a virtual probe for measuring the selected measuring point according to the calculated angles. In the embodiment, the determination module 23 determines a virtual probe corresponding to a minimum angle of the calculated angles for the selected measuring point. When the virtual probe has been determined, the workpiece measuring machine can measure the measuring point by rotating the real probe according to the first rotation angle and the second rotation angle of the virtual probe.

In step S26, the determination module 23 determines whether each measuring point of the measuring elements has been selected. If each measuring point of the measuring elements has been selected, step S28 is implemented. If any measuring point of the measuring elements remains to be selected, step S20 is repeated until all measuring points of the measuring elements have been selected.

In step S28, the sorting module 24 sorts all measuring points of the measuring elements according to the virtual probe of each measuring point. For example, if measuring points L, O, and Q correspond to the same virtual probe, such as the virtual probe "TIP/A 15, B 15", the measuring points L, O, and Q are placed into the same category.

In step S30, the combination module 25 combines measuring programs of the sorted measuring points that correspond to the same virtual probe, and outputs the combined measuring programs to the storage system 12. In the embodiment, each measuring point corresponds to a measuring program that is prestored in the storage system 12.

FIG. 7 is a flowchart of one embodiment of simulating the measuring process of the workpiece by executing the combined measuring programs. Depending on the embodiment, additional steps may be added, others removed, and the ordering of the steps may be changed.

In step S40, the simulation module 26 executes the combined measuring programs to simulate the measuring process of the workpiece.

In step S42, the simulation module 26 determines whether movements or routes of the virtual probes have intersections with the workpiece of the computerized drawing. If the movements or routes of the virtual probes have no intersections with the workpiece of the computerized drawing, in step S44, the simulation module 26 determines that the actual probe of the workpiece measuring machine will not collide with the workpiece, and ends the procedure. If the movements or routes of the virtual probes do have intersections with the workpiece of the computerized drawing, in step S44, the simulation module 26 determines that the actual probe of the workpiece measuring machine will collide with the workpiece.

In step S46, the recording module records the collision information into the storage system 12. In the embodiment, the collision information include all the intersections between the movements or routes of the virtual probes and the workpiece, and the virtual probes involved in the intersections.

In step S46, the recording module records the collision information into the storage system 12. In the embodiment, The collision information include all the interactions between the movements or routes of the virtual probes and the workpiece, and the virtual probes involved in the interactions.

All of the processes described above may be embodied in, and fully automated via, functional code modules executed by one or more general purpose computing devices or processors. The code modules may be stored in any type of non-transitory computer-readable medium or other storage device. Some or all of the methods may alternatively be embodied in specialized hardware. Depending on the embodiment, the non-transitory computer-readable medium may be a hard disk drive, a compact disc, a digital video disc, a tape drive or other suitable storage medium.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A computerized method for simulating a measuring process of a workpiece using a computing device, the method being performed by execution of computer readable programs by at least one processor of the computing device, comprising:

loading, by the at least one processor, a computerized drawing of the workpiece from a storage system of the computing device, and obtaining, by the at least one processor, coordinate information of measuring elements of the workpiece based on a work coordinate system;

defining, by the at least one processor, motion parameters of an actual probe of a workpiece measuring machine, the motion parameters comprising a horizontal range of a first rotation angle of a supported end of the actual probe, a vertical range of a second rotation angle of a free end of the actual probe, and a step angle of the actual probe;

creating, by the at least one processor, one or more virtual probes according to the motion parameters, wherein each of the one or more virtual probes comprises a first virtual rotation angle corresponding to the first rotation angle of the actual probe and a second virtual rotation angle corresponding to the second rotation angle of the actual probe;

calculating, by the at least one processor, a vector of each of the one or more virtual probes according to the first virtual rotation angle and the second virtual rotation angle of each of the one or more virtual probes;

acquiring, by the at least one processor, a vector of each measuring point of each of the measuring elements from the computerized drawing;

calculating, by the at least one processor, an angle between each said vector of said each measuring point and each said vector of said each of the one or more virtual probes;

determining, by the at least one processor, one of the one or more virtual probes for said each measuring point according to a minimum angle in the calculated angles;

sorting, by the at least one processor, said each measuring point of each of the measuring elements into different categories according to the determined virtual probe for said each measuring point, wherein each of said categories of the sorted measuring points corresponds to a same virtual probe;

combining, by the at least one processor, measuring programs of each of said categories of the sorted measuring points;

executing, by the at least one processor, the combined measuring programs of each of said categories of the sorted measuring points to simulate the measuring process of the workpiece using said same virtual probes corresponding to each of said categories of the sorted measuring points, and determining, by the at least one processor, whether the actual probe of the workpiece measuring machine will collide with the workpiece; and recording, by the at least one processor, collision information of the actual probe of the workpiece measuring machine and the workpiece into the storage system if the actual probe of the workpiece measuring machine will collide with the workpiece.

2. The method according to claim 1, wherein the creating step further comprises:

recording, by the at least one processor, the one or more virtual probes in a virtual probe list stored in the storage system.

3. The method according to claim 1, wherein the step of determining whether the actual probe of the workpiece measuring machine will collide with the workpiece is by determining whether movements or a route of at least one of said same virtual probes corresponding to each of said categories of the sorted measuring points have an interaction with the workpiece of the computerized drawing.

4. The method according to claim 3, wherein the collision information comprises the interaction of the movements or the route of said at least one of said same virtual probes corresponding to each of said categories of the sorted measuring points and the workpiece, and each of said at least one of said same virtual probes which has the interaction with the workpiece of the computerized drawing.

5. The method according to claim 1, wherein the measuring elements comprise points, lines, circles, and planes of the workpiece, and the computerized drawing is a computer aided design (CAD) drawing prestored in the storage system.

6. A computing device, comprising:
a storage system;
at least one processor; and
one or more programs stored in the storage system and being executable by the at least one processor, the one or more programs comprising:

a loading module operable to load a computerized drawing of a workpiece from the storage system, and obtain coordinate information of measuring elements of the workpiece based on a work coordinate system;

a creation module operable to define motion parameters of an actual probe of a workpiece measuring machine, the motion parameters comprising a horizontal range of a first rotation angle of a supported end of the actual probe, a vertical range of a second rotation angle of a free end of the actual probe, and a step angle of the actual probe, and create one or more virtual probes according to the motion parameters, wherein each of the one or more virtual probes comprises a first virtual rotation angle corresponding to the first rotation angle of the actual probe and a second virtual rotation angle corresponding to the second rotation angle of the actual probe;

a calculation module operable to calculate a vector of each of the one or more virtual probes according to the first virtual rotation angle and the second virtual rotation angle of each of the one or more virtual probes;

a determination module operable to acquire a vector of each measuring point of the measuring elements from the computerized drawing, calculate an angle between each said vector of said each measuring point and each said vector of said each of the one or more virtual probes, and determine one of the one or more virtual probes for said each measuring point according to a minimum angle in the calculated angles;

a sorting module operable to sort said each measuring point of each of the measuring elements into different categories according to the determined virtual probe for said each measuring point, wherein each of said categories of the sorted measuring points corresponds to a same virtual probe;

a combination module operable to combine measuring programs of each of said categories of the sorted measuring points;

a simulating module operable to execute the combined measuring programs of each of said categories of the sorted measuring points to simulate the measuring process of the workpiece using said same virtual probes corresponding to each of said categories of the sorted measuring points, and determine whether the actual probe of the workpiece measuring machine will collide with the workpiece; and a recording module operable to record collision information of the actual probe of the workpiece measuring machine and the workpiece into the storage system if the actual probe of the workpiece measuring machine will collide with the workpiece.

7. The computing device according to claim 6, wherein the creation module is further operable to record the one or more virtual probes in a virtual probe list stored in the storage system.

8. The computing device according to claim 6, wherein the simulating module determines whether the actual probe of the workpiece measuring machine will collide with the workpiece by determining whether movements or a route of at least one of said same virtual probes corresponding to each of said categories of the sorted measuring points have an interaction with the workpiece of the computerized drawing.

9. The computing device according to claim 8, wherein the collision information comprises the interaction of the movements or the route of said at least one of said same virtual probes corresponding to each of said categories of the sorted measuring points and the workpiece, and each of said at least one of said same virtual probes which has the interaction with the workpiece of the computerized drawing.

10. The computing device according to claim 6, wherein the measuring elements comprise points, lines, circles, and planes of the workpiece, and the computerized drawing is a computer aided design (CAD) drawing prestored in the storage system.

11. A non-transitory computer-readable storage medium storing a set of instructions, the set of instructions capable of being executed by a processor of a computing device, cause the computing device to perform a method for simulating a measuring process of a workpiece, the method comprising:
   loading a computerized drawing of the workpiece from a storage system of the computing device, and obtaining coordinate information of measuring elements of the workpiece based on a work coordinate system;
   defining motion parameters of an actual probe of a workpiece measuring machine, the motion parameters comprising a horizontal range of a first rotation angle of a supported end of the actual probe, a vertical range of a second rotation angle of a free end of the actual probe, and a step angle of the actual probe;
   creating one or more virtual probes according to the motion parameters, wherein each of the one or more virtual probes comprises a first virtual rotation angle corresponding to the first rotation angle of the actual probe and a second virtual rotation angle corresponding to the second rotation angle of the virtual probe;
   calculating a vector of each of the one or more virtual probes according to the first virtual rotation angle and the second virtual rotation angle of each of the one or more virtual probes;
   acquiring a vector of each measuring point of each of the measuring elements from the computerized drawing;
   calculating an angle between each said vector of said each measuring point and each said vector of said each of the one or more virtual probes;
   determining one of the one or more virtual probes for said each measuring point according to a minimum angle in the calculated angles;
   sorting said each measuring point of each of the measuring elements into different categories according to the determined virtual probe for said each measuring point, wherein each of said categories of the sorted measuring points corresponds to a same virtual probe;
   combining measuring programs of each of said categories of the sorted measuring points;
   executing the combined measuring programs of each of said categories of the sorted measuring points to simulate the measuring process of the workpiece using said same virtual probes corresponding to each of said categories of the sorted measuring points, and determining whether the actual probe of the workpiece measuring machine will collide with the workpiece; and
   recording collision information of the actual probe of the workpiece measuring machine and the workpiece into the storage system if the actual probe of the workpiece measuring machine will collide with the workpiece.

12. The non-transitory computer-readable storage medium according to claim 11, wherein the creating step further comprises:
   recording the one or more virtual probes in a virtual probe list stored in the storage system.

13. The non-transitory computer-readable storage medium according to claim 11, wherein the step of determining whether the actual probe of the workpiece measuring machine will collide with the workpiece is by determining whether movements or a route of at least one of said same virtual probes corresponding to each of said categories of the sorted measuring points have an interaction with the workpiece of the computerized drawing.

14. The non-transitory computer-readable storage medium according to claim 13, wherein the collision information comprises the interaction of the movements or the route of said at least one of said same virtual probes corresponding to each of said categories of the sorted measuring points and the workpiece, and each of said at least one of said same virtual probes which has the interaction with the workpiece of the computerized drawing.

15. The non-transitory computer-readable storage medium according to claim 11, wherein the measuring elements comprise points, lines, circles, and planes of the workpiece, and the computerized drawing is a computer aided design (CAD) drawing prestored in the storage system.

16. The non-transitory computer-readable storage medium according to claim 11, wherein the medium is selected from the group consisting of a hard disk drive, a compact disc, a digital video disc, and a tape drive.

* * * * *